United States Patent
Li et al.

(10) Patent No.: US 10,050,154 B2
(45) Date of Patent: Aug. 14, 2018

(54) TRENCH VERTICAL JFET WITH LADDER TERMINATION

(71) Applicant: United Silicon Carbide, Inc., Monmouth Junction, NJ (US)

(72) Inventors: Zhongda Li, Somerset, NJ (US); Anup Bhalla, Princeton Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 15/405,827

(22) Filed: Jan. 13, 2017

(65) Prior Publication Data

US 2017/0133518 A1 May 11, 2017

Related U.S. Application Data

(63) Continuation-in-part of application No. 14/798,631, filed on Jul. 14, 2015.

(51) Int. Cl.
*H01L 29/812* (2006.01)
*H01L 29/06* (2006.01)
(Continued)

(52) U.S. Cl.
CPC ........ *H01L 29/8122* (2013.01); *H01L 21/045* (2013.01); *H01L 21/046* (2013.01); *H01L 21/047* (2013.01); *H01L 21/0465* (2013.01); *H01L 21/0475* (2013.01); *H01L 21/0485* (2013.01); *H01L 21/76897* (2013.01); *H01L 29/0619* (2013.01); *H01L 29/0661* (2013.01); *H01L 29/0696* (2013.01); *H01L 29/1066* (2013.01); *H01L 29/1608* (2013.01); *H01L 29/45* (2013.01); *H01L 29/47* (2013.01); *H01L 29/66007* (2013.01); *H01L 29/66068* (2013.01); *H01L 29/66909* (2013.01); *H01L 29/8083* (2013.01); *H01L 29/8128* (2013.01); *H01L 29/665* (2013.01); *H01L 29/66045* (2013.01); *H01L 29/66848* (2013.01); *H01L 29/66856* (2013.01); *H01L 29/66969* (2013.01)

(58) Field of Classification Search
CPC ................................ H01L 29/06; H01L 29/47
See application file for complete search history.

(56) References Cited

U.S. PATENT DOCUMENTS

| 5,233,215 A | 8/1993 | Baliga et al. |
| 6,855,970 B2 | 2/2005 | Hatakeyama et al. |

(Continued)

FOREIGN PATENT DOCUMENTS

WO   WO 2012-131768 A1   10/2012

*Primary Examiner* — Joseph C Nicely
*Assistant Examiner* — Lamont Koo
(74) *Attorney, Agent, or Firm* — Baker & Hostetler LLP

(57) ABSTRACT

A vertical JFET with a ladder termination may be made by a method using a limited number of masks. A first mask is used to form mesas and trenches in active cell and termination regions simultaneously. A mask-less self-aligned process is used to form silicide source and gate contacts. A second mask is used to open windows to the contacts. A third mask is used to pattern overlay metallization. An optional fourth mask is used to pattern passivation. Optionally the channel may be doped via angled implantation, and the width of the trenches and mesas in the active cell region may be varied from those in the termination region.

20 Claims, 18 Drawing Sheets

(51) Int. Cl.
*H01L 29/66* (2006.01)
*H01L 29/47* (2006.01)
*H01L 21/04* (2006.01)
*H01L 21/768* (2006.01)
*H01L 29/45* (2006.01)
*H01L 29/808* (2006.01)
*H01L 29/10* (2006.01)
*H01L 29/16* (2006.01)

(56) References Cited

U.S. PATENT DOCUMENTS

| | | |
|---|---|---|
| 7,009,228 B1 | 3/2006 | Yu |
| 8,519,410 B1 | 8/2013 | Odekirk et al. |
| 2005/0029557 A1 | 2/2005 | Hatekeyama et al. |
| 2005/0258454 A1 | 11/2005 | Kumar et al. |
| 2006/0071217 A1 | 4/2006 | Ohyanagi et al. |
| 2006/0214242 A1 | 9/2006 | Carta et al. |
| 2010/0163935 A1 | 7/2010 | Shimizu et al. |
| 2013/0168764 A1 | 7/2013 | Hsieh |
| 2014/0084363 A1 | 3/2014 | Pearse et al. |
| 2015/0084120 A1* | 3/2015 | Weber ............... H01L 29/7804 257/329 |
| 2015/0200250 A1 | 7/2015 | Lin et al. |
| 2015/0236089 A1* | 8/2015 | Kagotoshi ........... H01L 29/0619 257/77 |
| 2015/0349091 A1 | 12/2015 | Yilmaz et al. |
| 2016/0155714 A1 | 6/2016 | Hilsenbeck et al. |

\* cited by examiner

US 10,050,154 B2

1

TRENCH VERTICAL JFET WITH LADDER TERMINATION

CROSS-REFERENCE TO RELATED APPLICATIONS

This application is a continuation-in-part of U.S. patent application Ser. No. 14/798,631 (Li, et al.), filed on Jul. 14, 2015, titled "Vertical JFET made using a reduced masked set," the content of which is hereby incorporated by reference in its entirety.

BACKGROUND

Vertical junction field-effect transistors (JFETs) made from materials such as silicon carbide (SiC) are useful in power electronic circuits, such as power factor correction (PFC) circuits, DC-DC converters, DC-AC inverters, and motor drives. The performance of vertical SiC JFETs may be improved through the use of edge terminations.

SUMMARY

A vertical FET with a ladder termination is made from semiconductor materials such as silicon carbide (SiC) by a process using a limited number of masks. A first mask is used to form mesas and trenches in active cell and termination regions simultaneously. A mask-less self-aligned process is used to form silicide source and gate contacts. A second mask is used to open windows to the contacts. A third mask is used to pattern overlay metallization. An optional fourth mask is used to pattern passivation. Optionally, the channel may be doped via one or more angled implantations, and the width of the trenches and mesas in the active cell region may be varied from those in the termination region.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying figures. The figures are not necessarily drawn to scale. Analogous items in the figures are generally labelled with reference designators with similar ending numbers.

FIG. 5 is a cross-sectional view of the starting material for fabricating the JFET.

2

Figure 6:
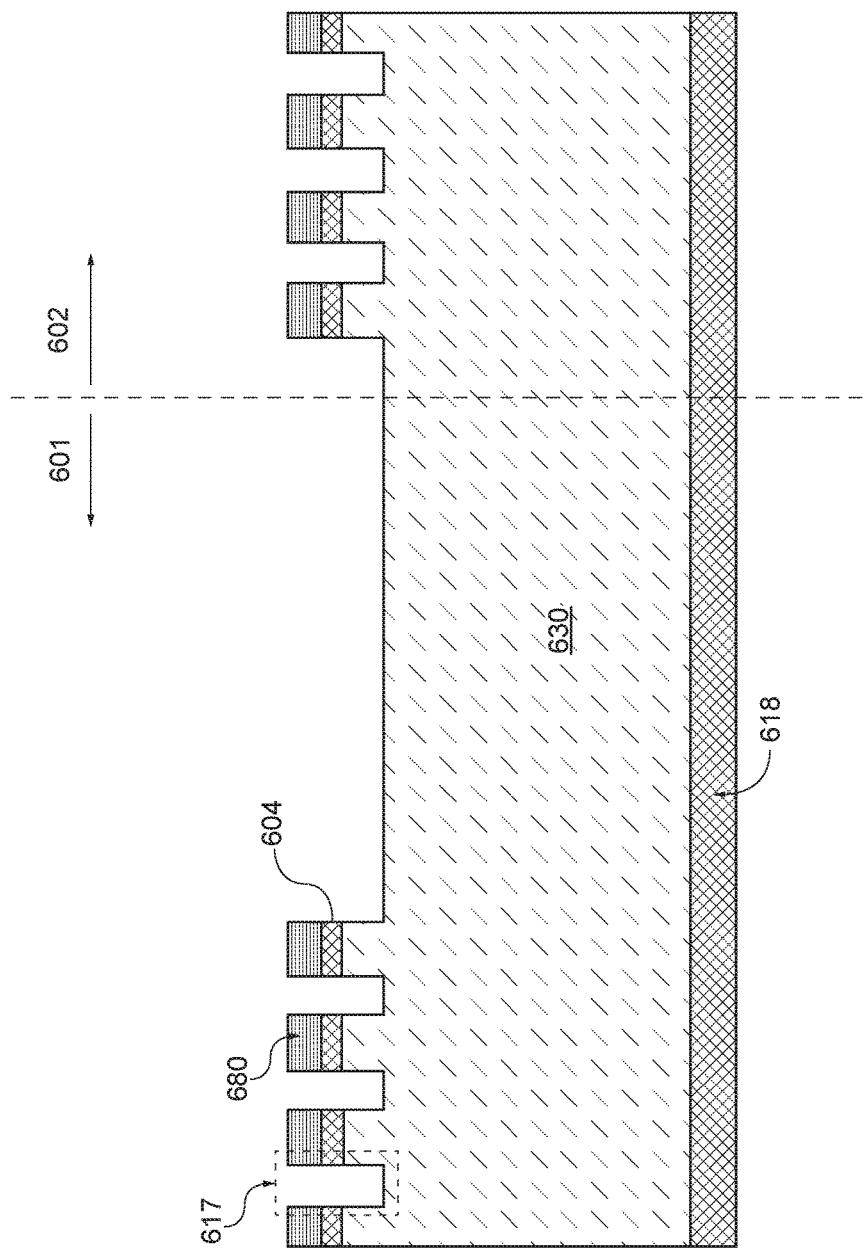

FIG. 6 is a cross-sectional view of the JFET of the first embodiment in process after trench etching using a hard masking layer that is defined by a first mask.

Figure 7:
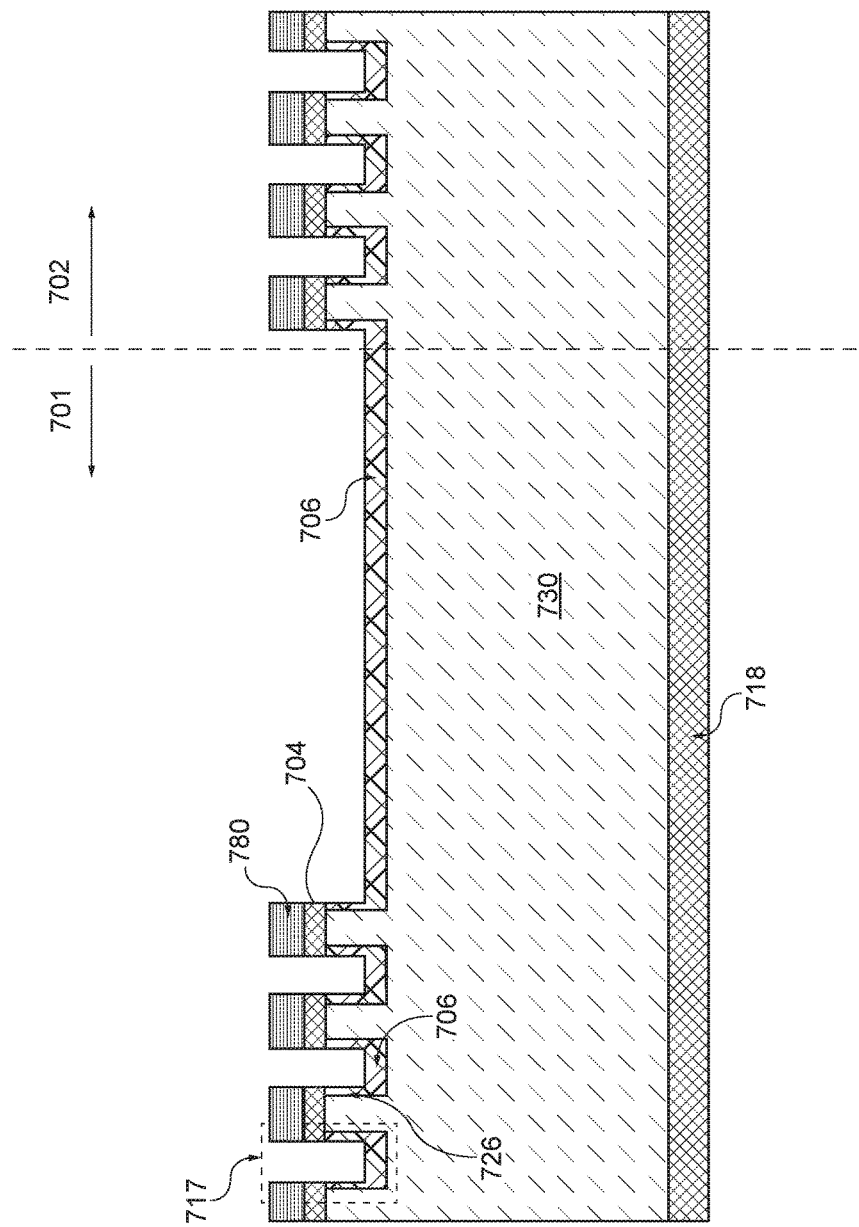

FIG. 7 is a cross-sectional view of the JFET of the first embodiment in process after vertical and tilted implantations of the first doping type with the hard masking layer in place.

Figure 8:
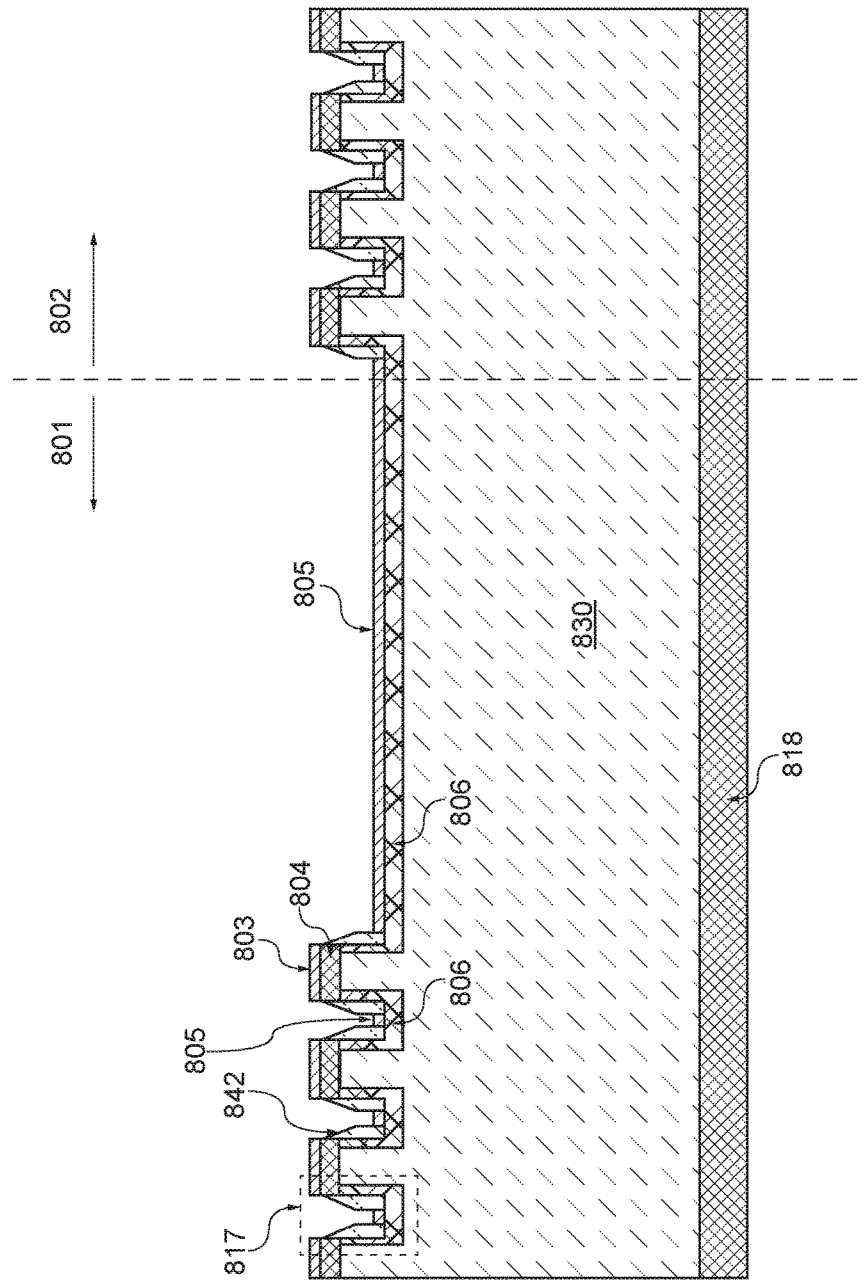

FIG. 8 is a cross-sectional view of the JFET of the first embodiment in process after oxide spacer and silicide formation in the active cell region and the termination region.

Figure 9:
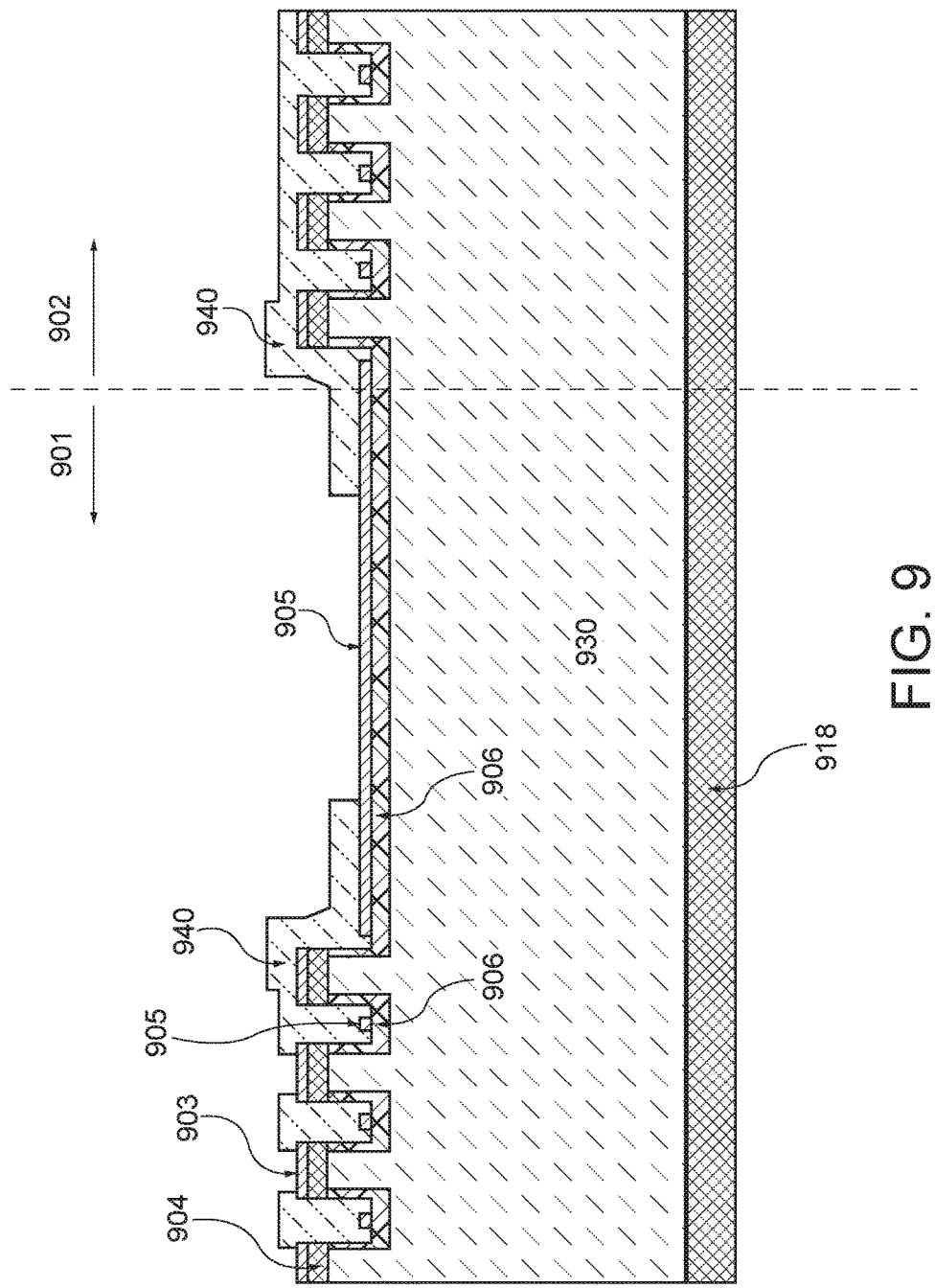

FIG. 9 is a cross-sectional view of the JFET of the first embodiment in process after trench filling and window opening for source and gate contacts using a second mask.

Figure 10:
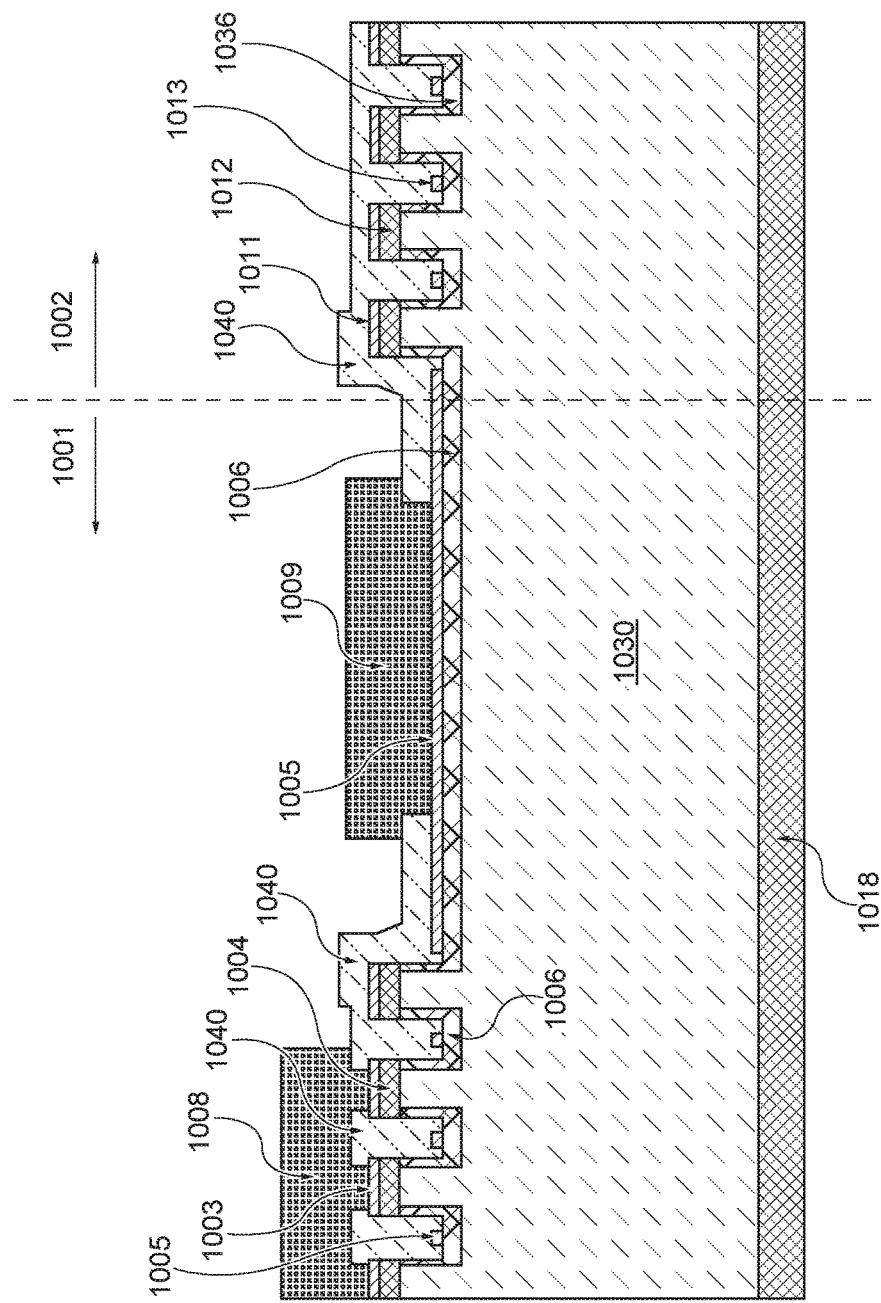

FIG. 10 is a cross-sectional view of the JFET of the first embodiment in process after depositing and patterning the top metal using a third mask.

Figure 11:
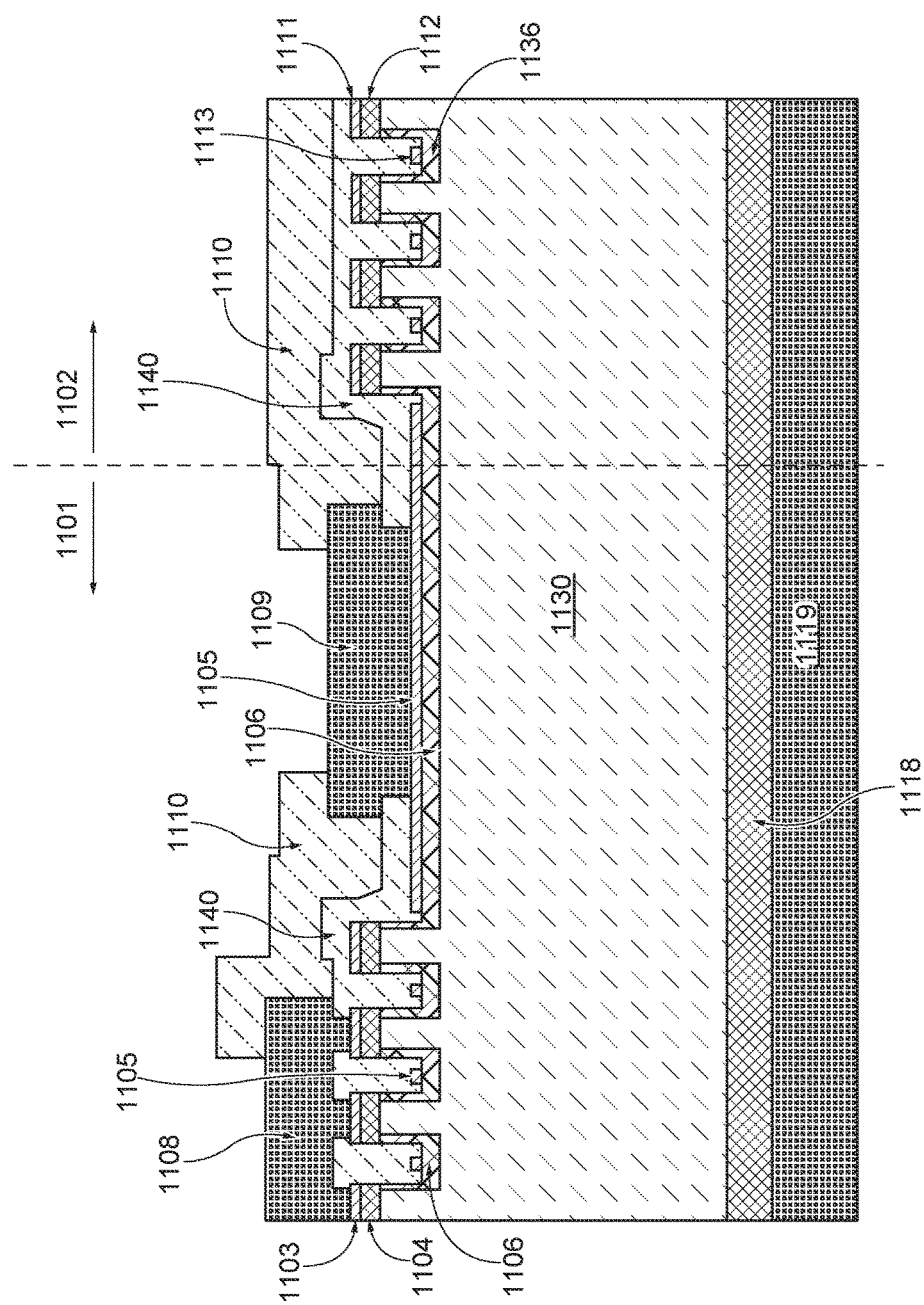

FIG. 11 is cross-sectional view of the completed JFET after forming the passivation layer using a fourth mask.

Figure 12:
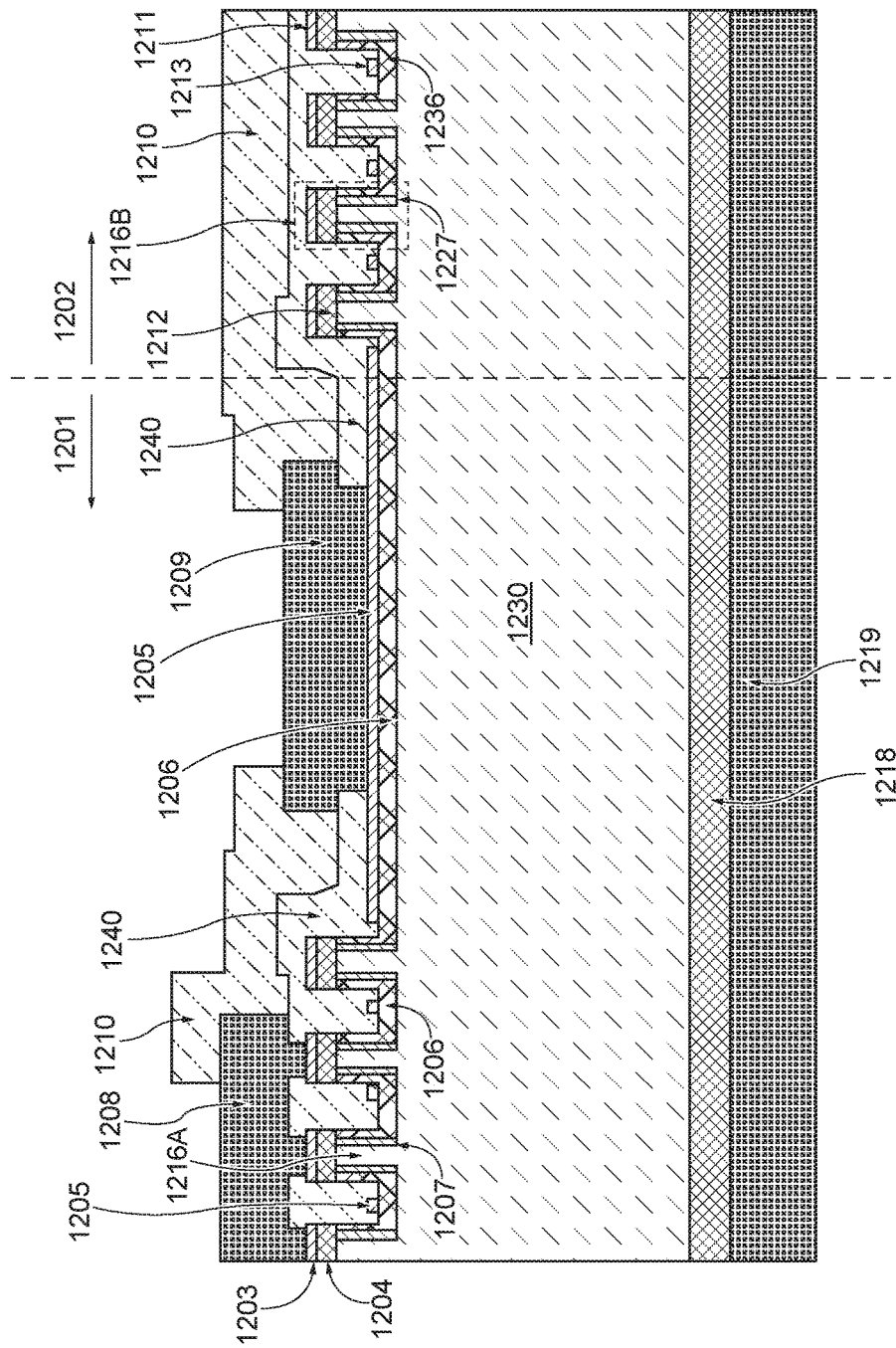

FIG. 12 is a cross-sectional view of a second illustrative embodiment of a JFET.

Figure 13:
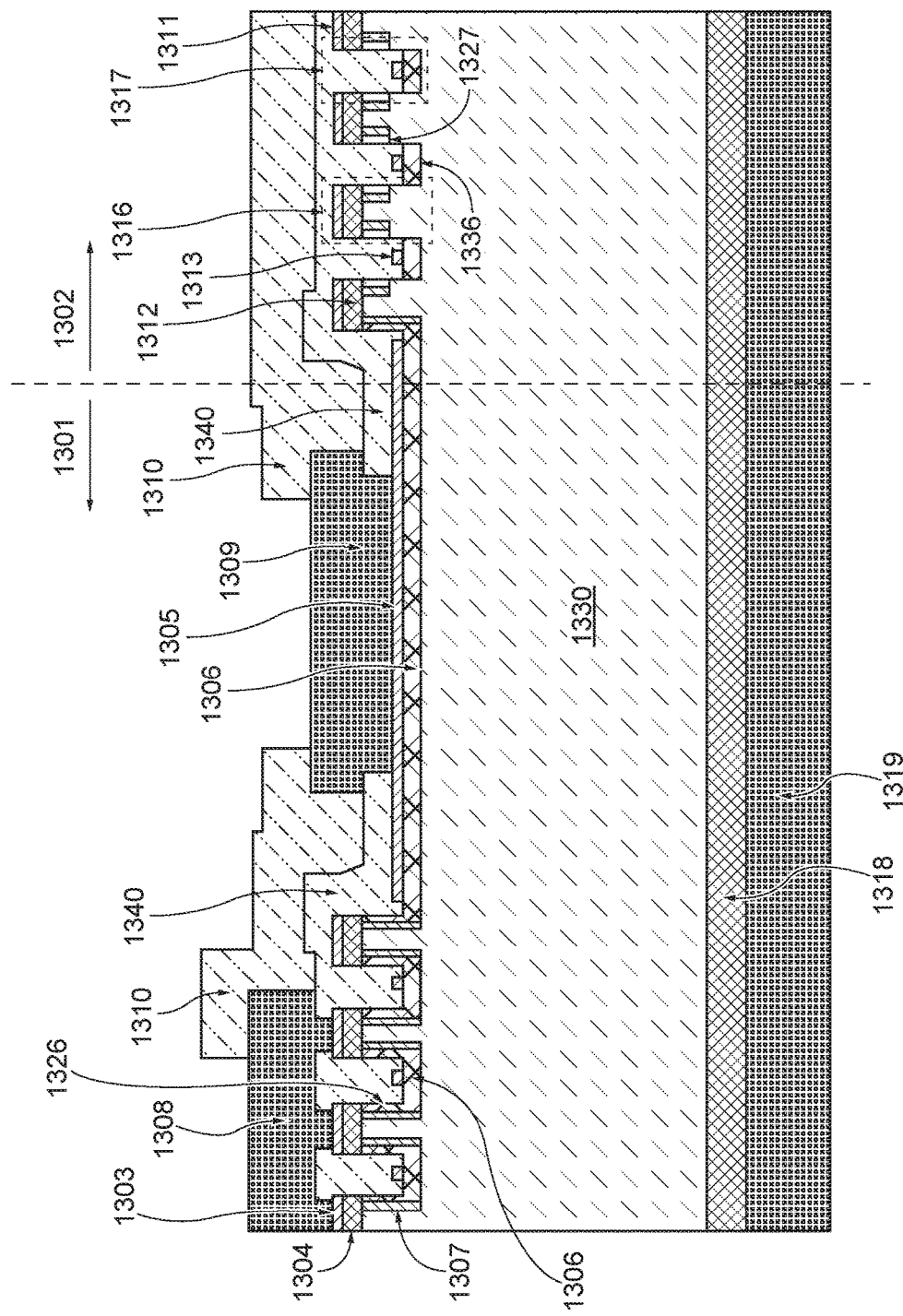

FIG. 13 is a cross-sectional view of a third illustrative embodiment of a JFET.

Figure 14:
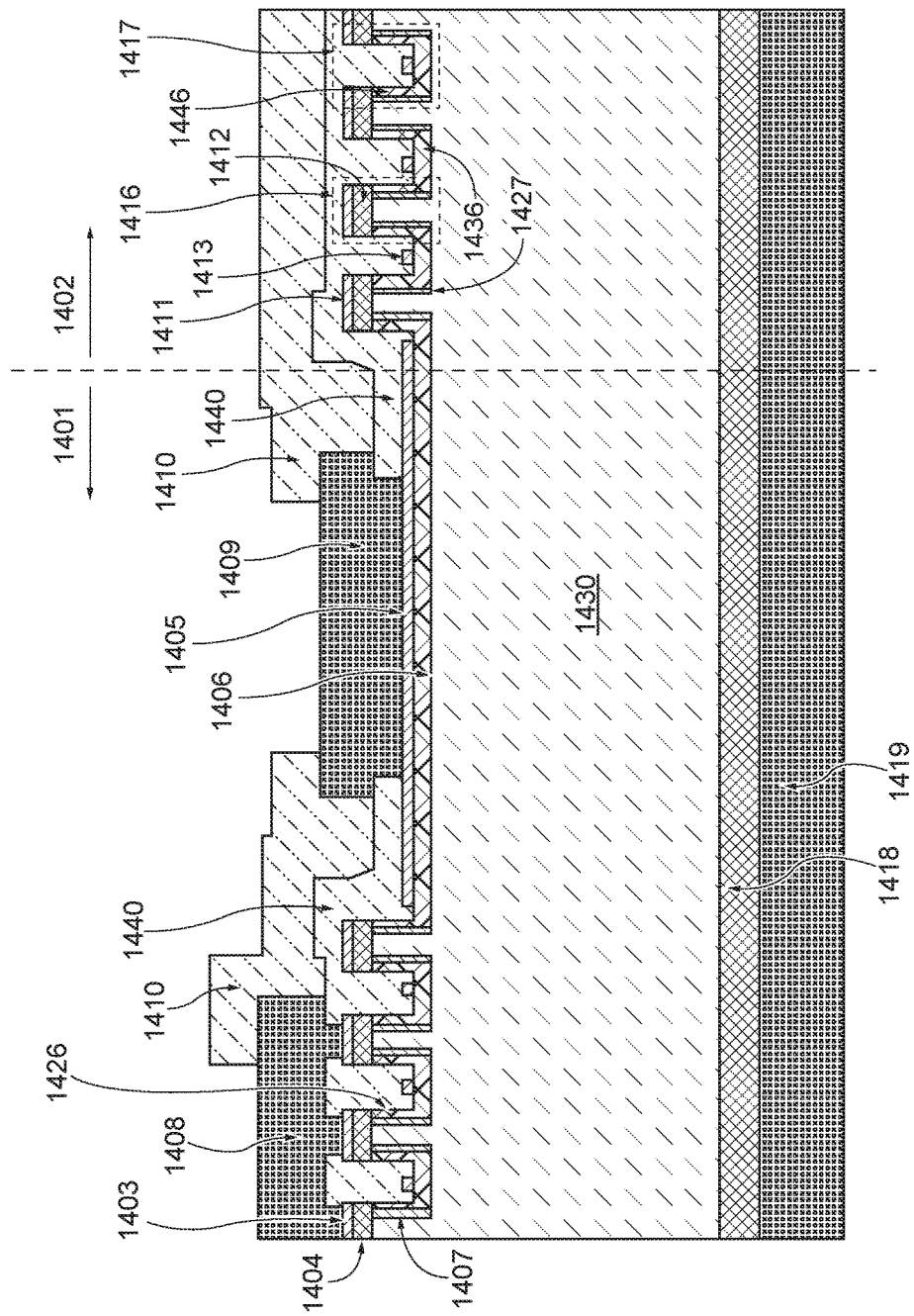

FIG. 14 is a cross-sectional view of a fourth illustrative embodiment of a JFET.

Figure 15:
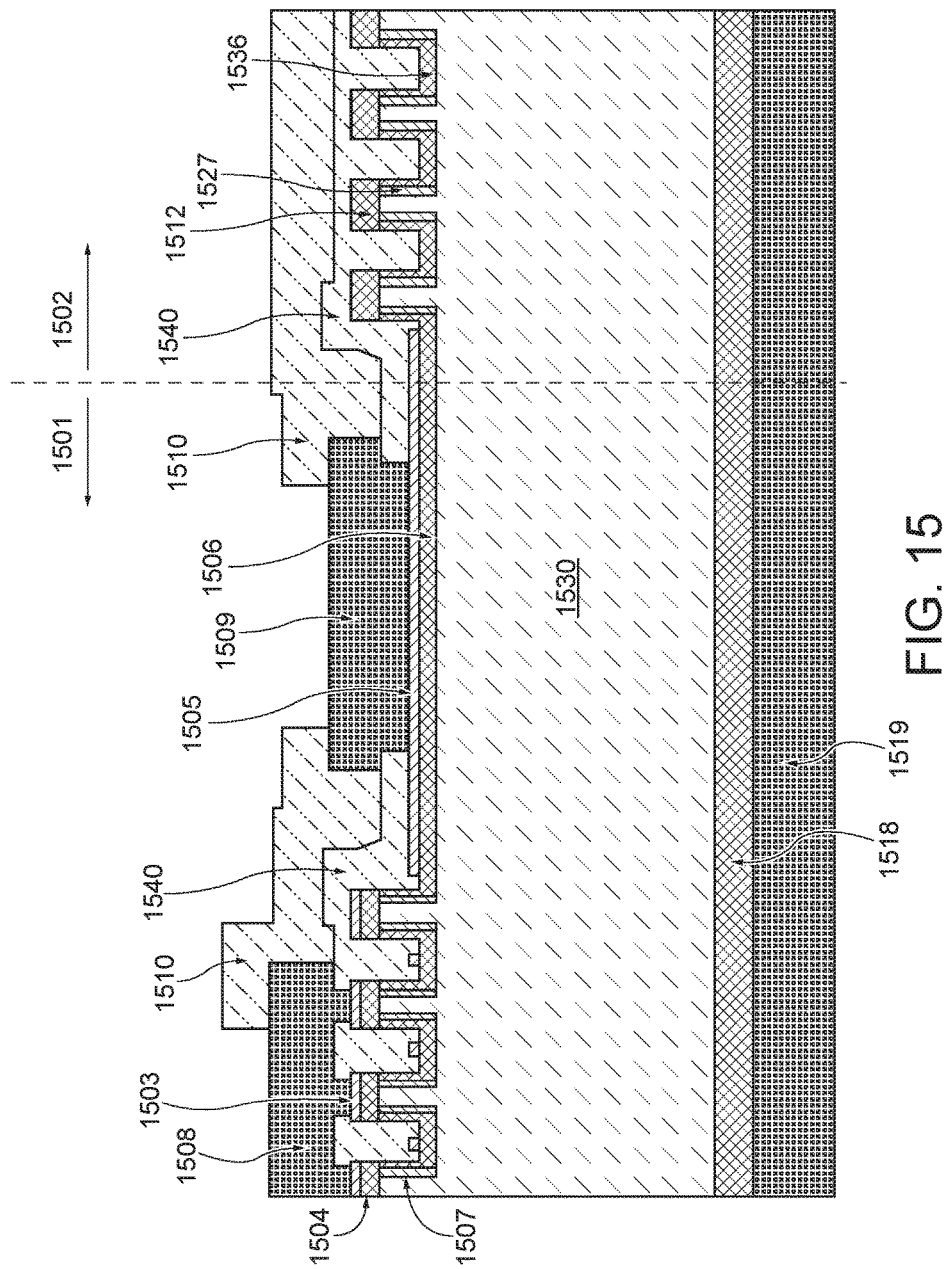

FIG. 15 is a cross-sectional view of a fifth illustrative embodiment of a JFET.

Figure 16:
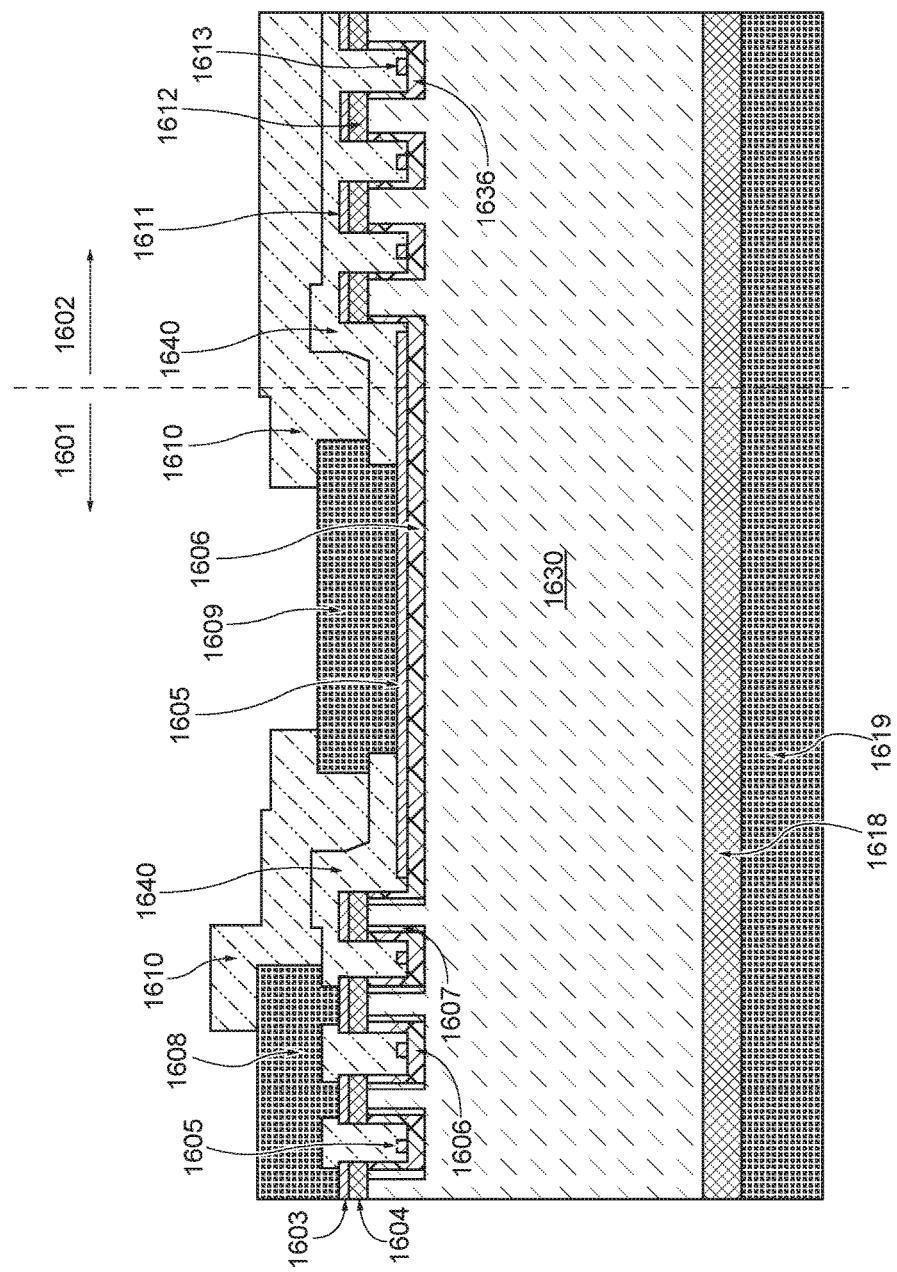

FIG. 16 is a cross-sectional view of a sixth illustrative embodiment of a JFET.

Figure 17:
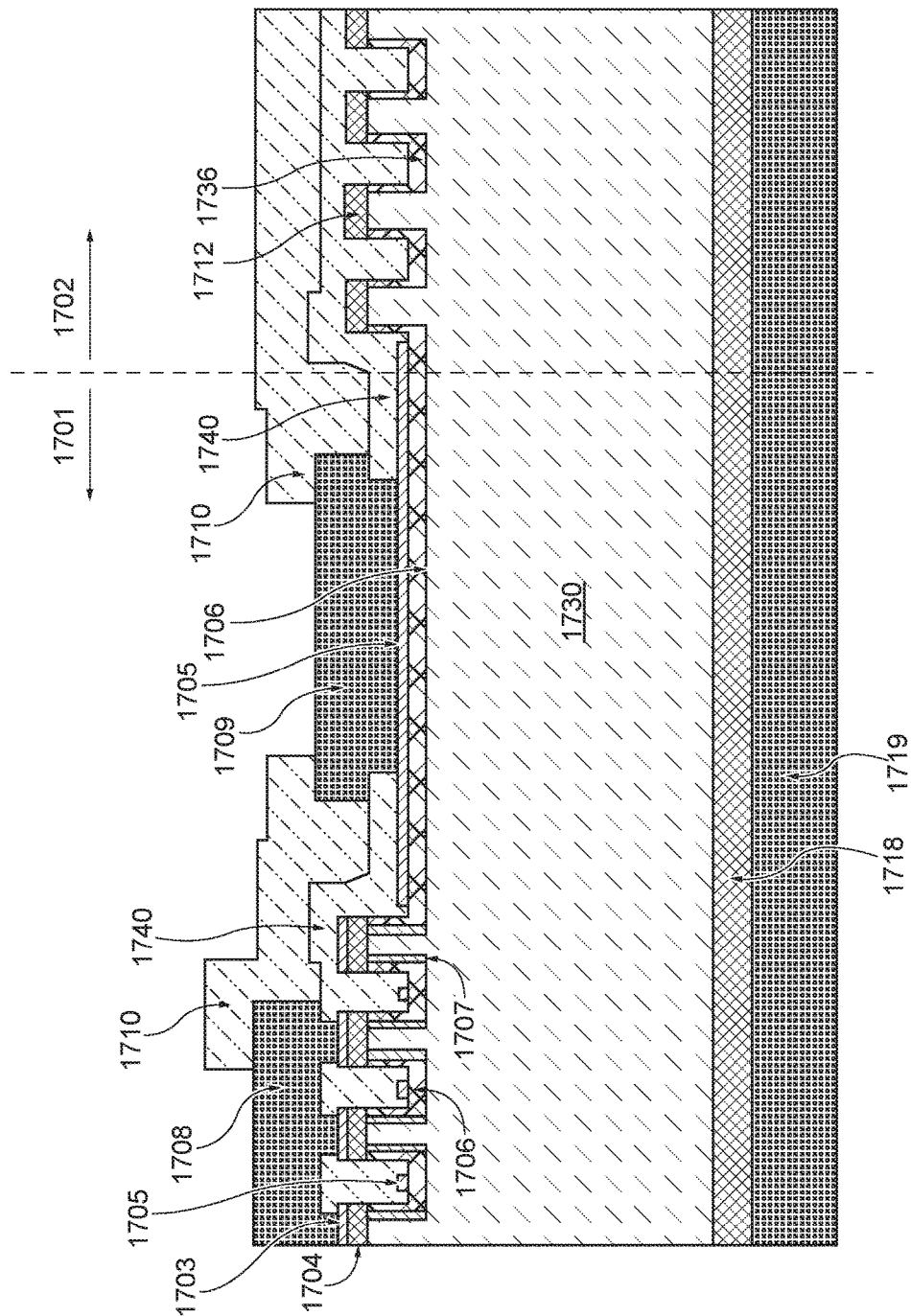

FIG. 17 is a cross-sectional view of a seventh illustrative embodiment of a JFET.

Figure 18:
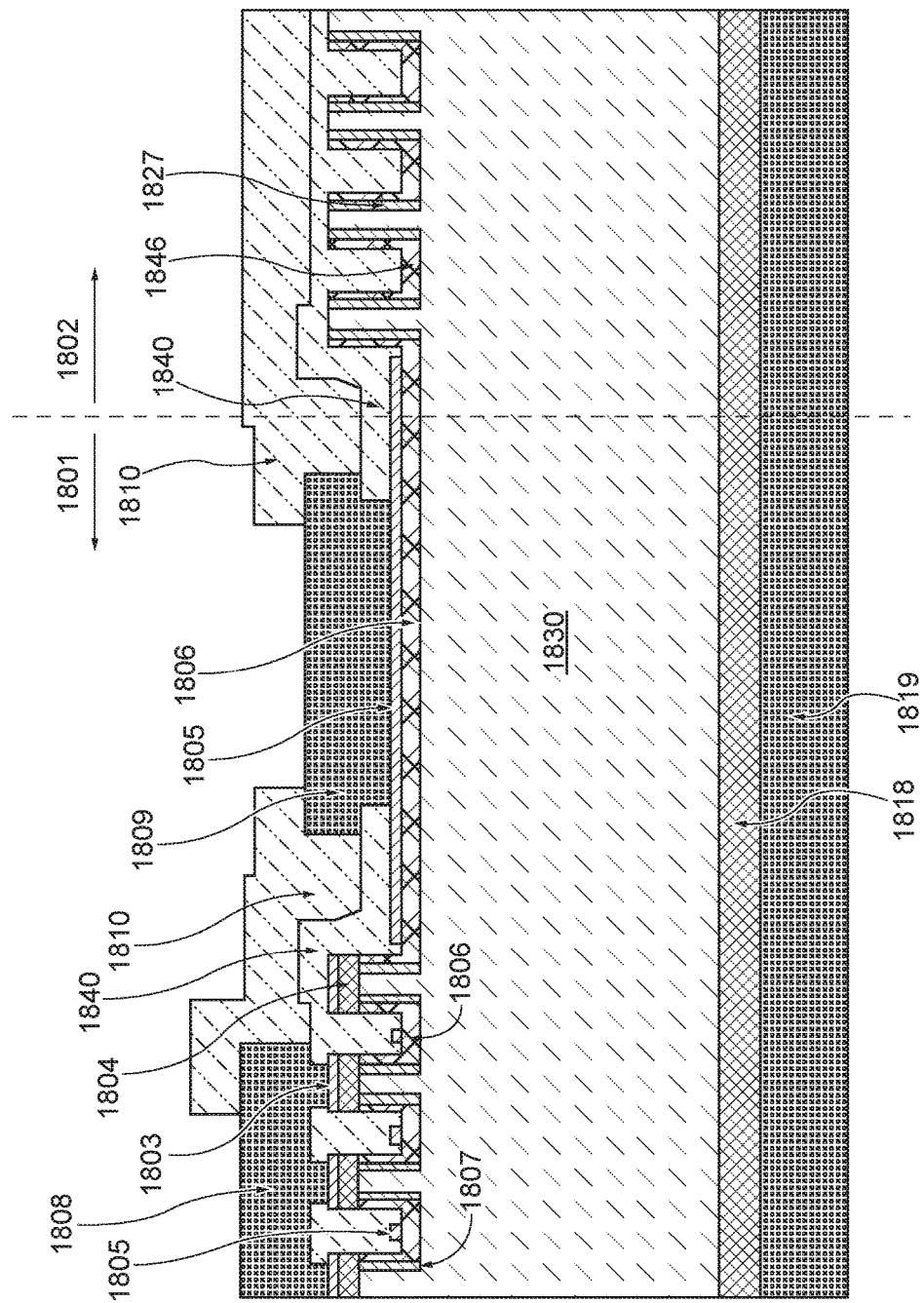

FIG. 18 is a cross-sectional view of an eighth illustrative embodiment of a JFET.

DETAILED DESCRIPTION OF ILLUSTRATIVE EMBODIMENTS

A vertical JFET may be made from semiconductor materials such as silicon carbide (SiC) by a process using a limited number of masks in a simplified process, thereby reducing costs. Other semiconductor materials suitable for the creation of such JFETs include silicon (Si), gallium nitride (GaN), aluminum nitride (AlN), gallium oxide ($Ga_2O_3$), and diamond, for example.

A first mask is used to form mesas and trenches in active cell and termination regions simultaneously. A mask-less self-aligned process is used to form silicide source and gate contacts. A second mask is used to open windows to the contacts. A third mask is used to pattern overlay metallization. An optional fourth mask is used to pattern passivation. Optionally the channel may be doped via angled implantation, and the width of the trenches and mesas in the active cell region may be varied from those in the termination region.

Additional masks may be employed to implement a number of variations. For example, channel implant and silicide formation in the termination region may be blocked by additional masks, or additional masks may be employed to remove certain features from the termination region after they are formed across the wafer.

Figure 1:
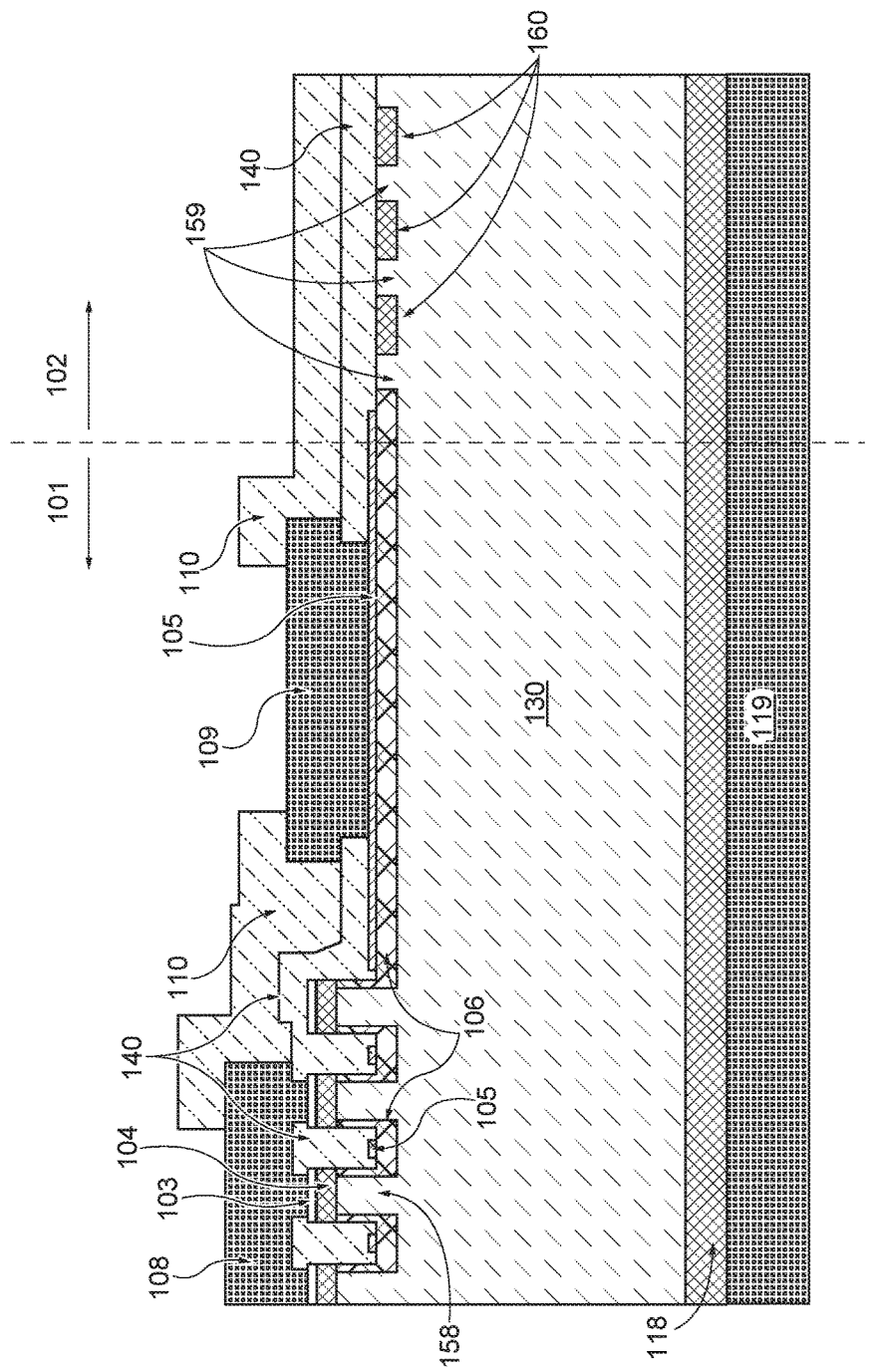
FIG. 1 provides, for reference, a cross-sectional view of a prior art vertical JFET with planar floating guard-ring termination.

FIG. 1 is a vertical cross-sectional view of a prior art SiC vertical channel JFET with planar guard ring termination. A drain electrode 119 is at the bottom of the device. In the active region 101, a source electrode 108 is at the top. A gate electrode 109 is connected by a gate silicide 105 to a gate region 106. The gate region 106 is doped with a first doping type. The gate silicide 105 is present at the bottoms of the trenches as well as beneath the gate electrode 109. The gate silicide 105 is electrically contiguous, although the connections from the trench bottoms to the area beneath the gate electrode are not shown in FIG. 1. The source electrode 108 is connected by a source silicide 103 to a source region 104. The source region 104 is heavily doped with a second doping type that is the opposite type of the first doping type. The drain electrode 119 contacts a drain region 118 that is heavily doped with the second doping type. The gate region 106 extends to the bottoms and side walls of the trenches, and is formed by implantations of the first doping type at zero degrees and at tilted angles. The channel region 158 is doped with the second doping type and connects the source region 104 to the drift region 130, where current is then conducted to the drain region 118. In the termination region 102 are guard rings 160 that are heavily doped with the first doping type. There are gaps 159 between each of the guard rings 160. The gaps 159 are doped with the second doping type. The potentials of the guard rings 160 are floating. The termination region 102 and portions of the active cell region 101 are covered by an interlayer dielectric 140 and/or a passivation layer 110. The interlayer dielectric 140 also fills the trenches in the active region 101.

Figure 2:
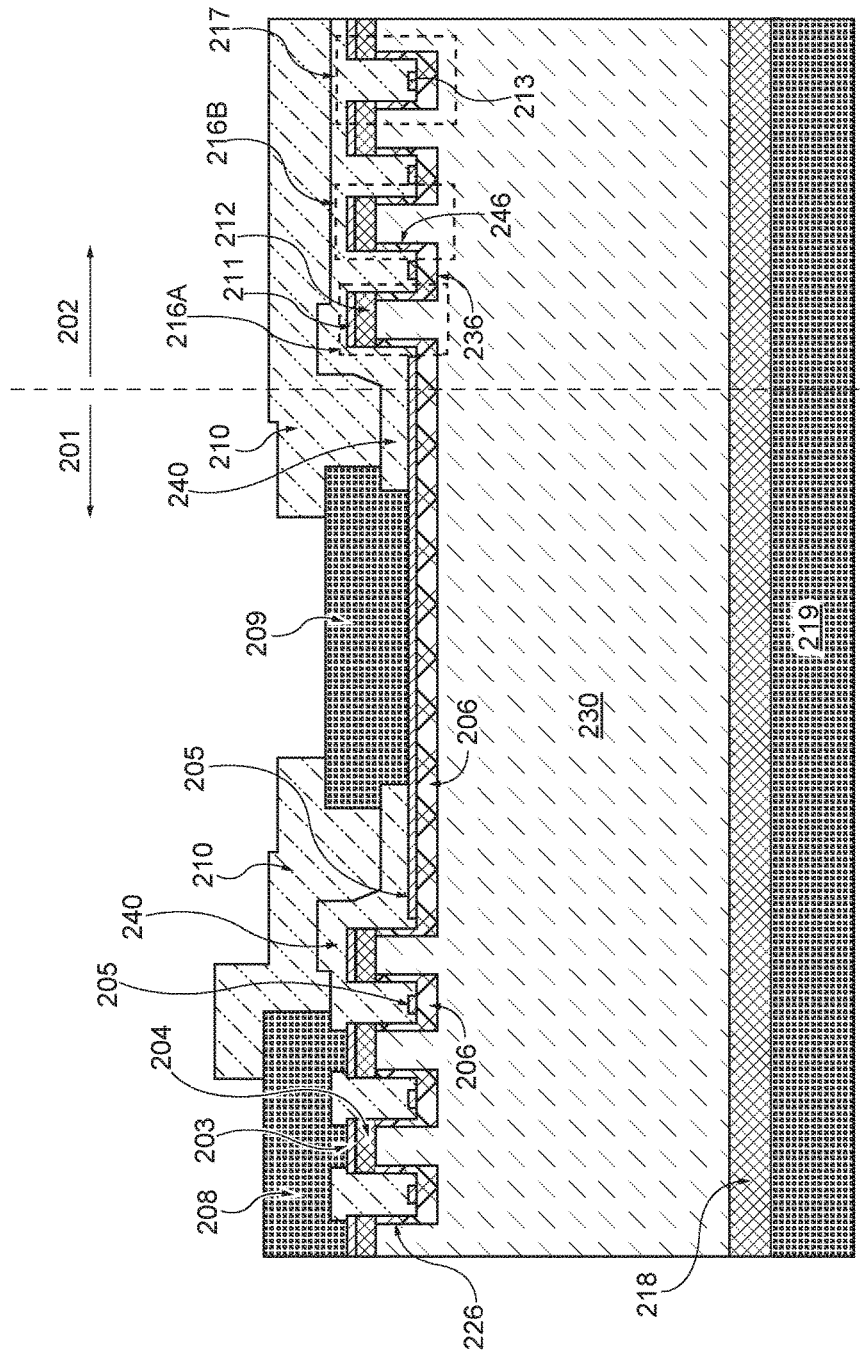
FIG. 2 illustrates a cross-sectional view of a first illustrative embodiment of a vertical JFET with trench guard-ring terminations made using a set of four masks.

FIG. 2 is a vertical cross-sectional view of an illustrative first embodiment of a vertical JFET with trench guard-ring terminations made using a set of four masks. The drain electrode 219 contacts the drain region 218. The drain region 218 is heavily doped with the second doping type. Not shown between the electrode 219 and the drain 218, a silicide may be used to connect a metal electrode to a heavily doped semiconductor region. Above the drain region 218 is the drift region 230. The drift is lightly doped with second doping type. There are trenches, such as trench 217, in both the active cell region 201 and the termination region 202. The trenches in both the active region 201 and termination region 202 may be created simultaneously, e.g., by etching. The trenches are separated by mesas such as mesas 216A and 216B. The width of the mesas in the termination region 202 may either be equal to, smaller than, or larger than the width of the mesas in the active cell region 201.

A vertical channel JFET in the active cell 201 includes a gate region 206 that may be formed, for example, by implantation of the first doping type. The gate region 206 may implanted vertically to dope the trench bottom. Additionally, as shown in FIG. 2, the gate region may extend to the sidewalls 226 of the trenches, e.g., by implantation at a tilted angle, to dope the sidewalls of the mesas. The trenches are filled with an interlayer dielectric 240. The JFET of FIG. 2 is shown with a passivation layer 210.

The same implantations used to dope the bottom 206 and sidewalls 226 of the trenches in the active region 201 may be used to create faux-gate doped elements 236 at the bottoms of the trenches in the termination region 202. In the example of FIG. 2, the faux-gate regions 236 include a portion extending and sidewalls 246. The faux-gate regions 236 are floating, being not connected to the gate regions 206 of the active region 201. Further, the faux-gate region in each trench in the termination area 202 is not connected to the faux-gate region in any other trench. Thus the faux-gate regions on the left and right of each mesa in the termination area 202 can float to different potentials.

The mesas in the termination region 202 have a heavily doped region faux-source 212 of the second doping type at the top. These regions 212 may be formed at the same time as the source region 204 atop the mesas in the active cell region 201. However the faux-source regions 212 are floating, being connected neither to each other nor to the source regions 204 of the active area 201. In the active cell region 201, a source silicide contact 203 sits on top of the mesa, above the source region 204. The gate silicide contact 205 sits at the bottom of the trench above the gate region 206 in the active area 201 and beneath the gate electrode 209. In the termination region 201, there is a silicide 211 on top of the mesa and a silicide 213 at the bottom of the trench. All the silicide contacts may be formed simultaneously using self-aligned processes. The source silicide contacts 203 in the active cell region are connected to the source electrode 208. The gate silicide contacts 205 are connected to the gate electrode 209, e.g., through connections which are not in the plane of the vertical cross section of FIG. 2.

The silicide contacts in the termination region 211 and 213 are floating. In other words, the contacts 211 and 213 are ohmically isolated, having no conductive material path connecting them to each other each within each mesa or from mesa to mesa. These silicides 211 and 213 are not connected to each other or to any electrode, such that the electrical potentials of such silicides in the trenches and mesas of the termination region 202 are independent. Similarly, the heavily doped regions of opposite doping types in the trenches and mesas of the termination region 202 are floating and have independent electrical potentials, such that, for example, the electrical potential of the silicide 213 in trench 217 is independent from that of the trench sidewall 246 of mesa 216B.

The doped elements 212 and 236 are neither connected to each other within the mesa, nor are like elements joined from mesa to mesa. Each doped element in each termination region mesa floats to its own potential. The doped elements are nonetheless adjacent, and thus form P-N junctions. Since the faux-gate regions on the left and right side of each mesa in the termination area 202 are floating, the mesas in the termination region form a back-to-back structure, e.g., a PNP structure.

When a small potential is applied to the drain contact 219, the same potential is taken by drain 218, drift 203, and faux-source regions 212. A reverse bias appears at the junction between the faux-gate 236 and faux-source 212 regions in the leftmost mesa 216A in the termination area 202. As the voltage increases, the mesa 216A depletes until punch-through occurs to the faux-gate region of the trench to the right of mesa 216A. Punch-through may be described as the point where the depletion region reaches the outer faux-gate sidewall junction. The device is designed such that this punch-through occurs before the avalanche breakdown of the faux-source to faux-gate junction. Once the drain contact 219 potential is increased further past the point when the first mesa 216A punch-through has occurred, the second mesa 216B begins to deplete just as the first mesa 216A did. The voltage is again supported between the faux-gate 236 and faux-source 212 of the second mesa 216B until, and a higher potential, the second mesa 216B depletes and punch-through to the faux-gate of the mesa to the right of mesa 216B occurs. In this manner, a potential ladder is created, with each mesa handling a potential difference set by the punch though between adjacent faux-gates.

By adding enough such termination mesas concentrically around active area of the device, for example, the field can be spread to form a high voltage termination region 202, where a potential appears also at the faux-source to faux-gate junction within each mesa. The key to the termination structure is to have an avalanche breakdown voltage between faux-gate and faux-source that is higher than the punch-through voltage between the left and right faux-gates in each mesa. With that, a ladder termination can be built, because the faux-gate to faux-source is shielded from breakdown by the punch-through action, and does not limit the overall blocking voltage of the device. For example, if the avalanche breakdown voltage of the faux-gate to faux-source is designed to be 50V, each termination mesa may be designed to punch though at 30V. By using 30 such rings, a total voltage of 900V may be supported, as long as the active cells are designed to reach that voltage as well before breakdown. Due to process variations, the punch-through voltage and faux-gate-source breakdown voltages may vary, but the design margin should always ensure that the punch-through voltage in each mesa is less than the faux-gate-source avalanche breakdown voltage.

This termination structure differs from standard guard ring terminations in that the adjacent faux-gate regions are separated by actual faux-source regions, which are not present in, for example, the termination 102 of FIG. 1. In FIG. 2, the voltage at each ring appears at the faux-gate-faux-source junction. This is different from the guard rings in region 102 of FIG. 1, where the voltage appears between the guard ring 160 and the lightly doped drift region 159.

Figure 3:
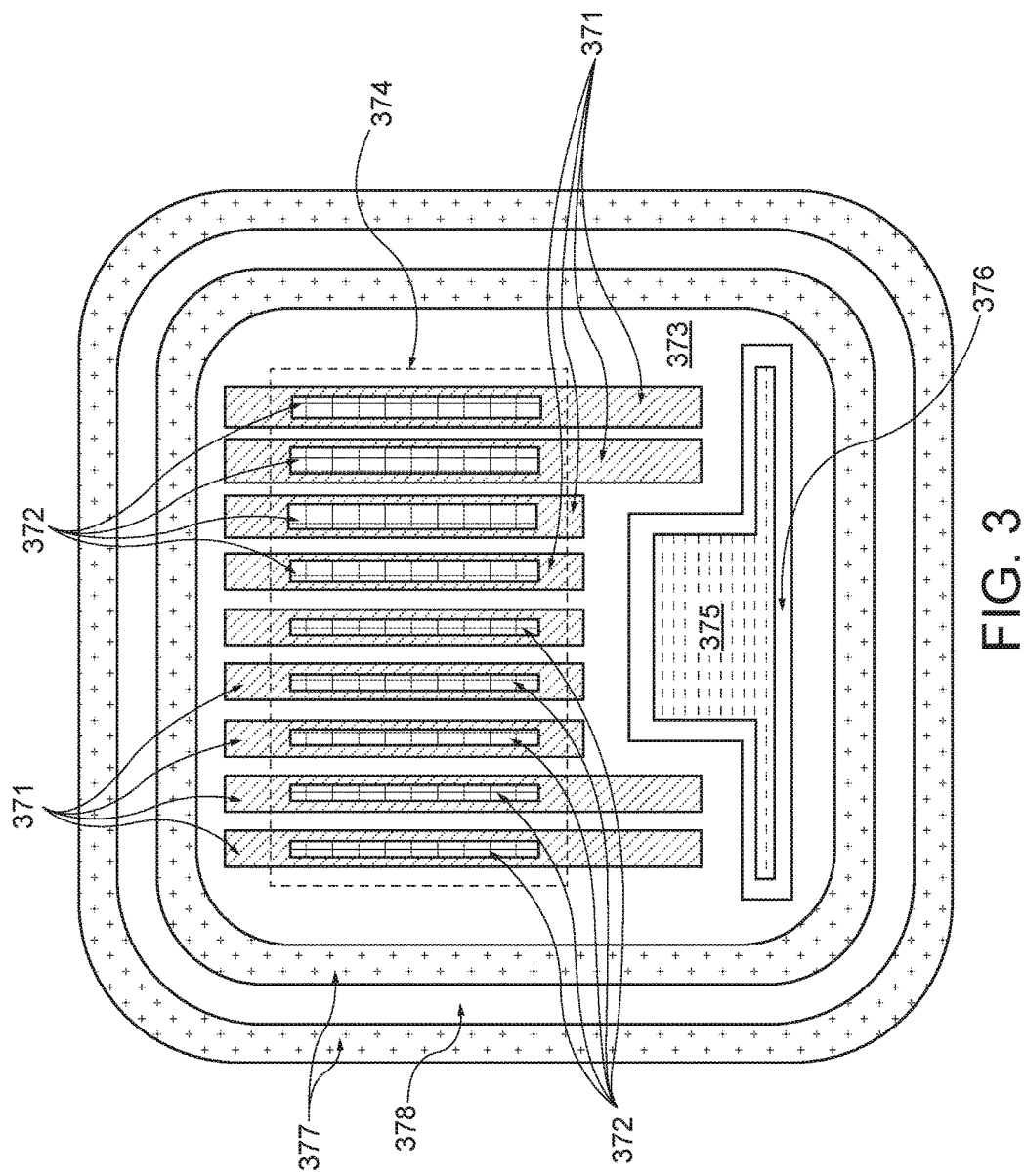
FIG. 3 is a top view of an example layout for the JFET of the first embodiment.

FIG. 3 is a top view of an example layout of a JFET such as the JFET of the first embodiment. In the active area, the mesas 371 are parallel to each other. In the termination region, the mesas 377 are concentric. Outside of the mesas 371, the semiconductor, such as SiC or GaN, is etched, leaving trenches in the active area such as trench 373, and trenches in the termination region such as trench 378. Not shown in FIG. 3, silicide contacts are formed on the top of the mesas 371 and at the bottom of the active trenches 373, using a self-aligned process. The self-aligned process uses an oxide spacer to ensure that the silicide at the top of the mesas 371 does not short to the silicide at the bottom of the trenches 373. A source contact window 372 is opened in the inter-layer dielectric to make contact between the source silicide 371 and the source overlay metal 374. The gate contact window 375 is opened in the inter-layer dielectric to make contact between the gate silicide contacts 373 to the gate overlay metal 376. In the termination area, the mesas 377 and trenches 378 are formed at the same time as those in the active region, and silicide contacts may be formed on top of the mesas 377 and at the bottom of the trenches 378, during the same self-aligned silicide formation process in the active region. However, if any such contacts are formed in the termination region, they are not connected to the gate overlay metal 376 or the source overlay metal.

Figure 4:
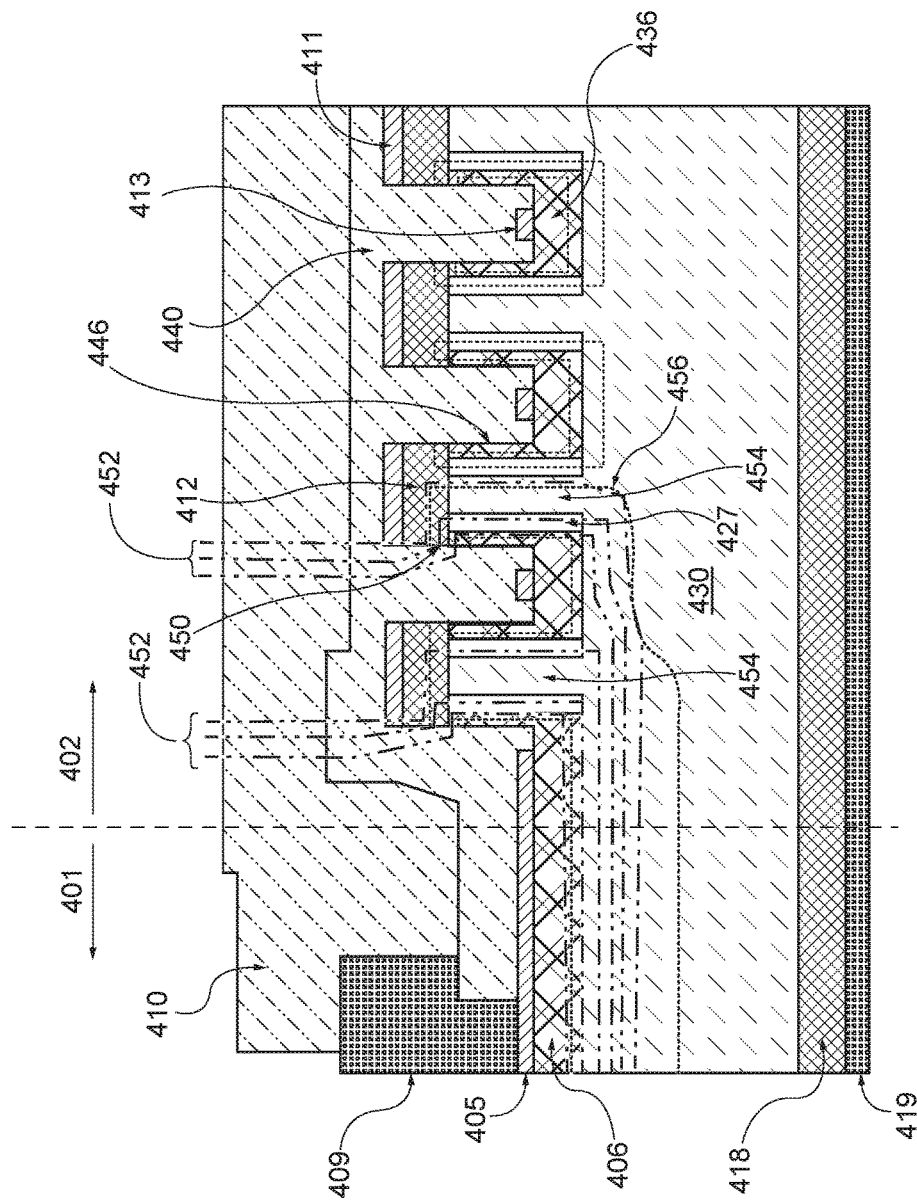
FIG. 4 is a cross-sectional view of the termination region of the JFET of the first embodiment.

FIG. 4 is an annotated cross-sectional view of the termination region 402 of the JFET of the first embodiment. A portion of the active area 401 is also shown. For purposes of the examples herein, it may assumed that this is an npn JFET, such that the first doping type is p-type and the second doping type is n-type. In practice, npn and pnp devices may be made by the processes described herein. As the drain voltage increases, the p-n junction 450 between the heavily doped region of the second doping type 412 and the mesa sidewall 446, which is doped with the first type, is reverse biased, while the regions in the middle of the mesa doped with the second doping type 454 and 427 are being depleted.

The use of two separate doping regions 454 and 427 in the middle of the mesa is optional, and may result from using such optional doping in the active region 401 while using the same masks and processes to form the termination region 402.

The trench bottoms 436 and sidewalls 446 in termination region 402 are doped with the first doping type, e.g., with the same material used for the gate 406 in the active region. However, in the termination region 402, the trench bottoms 436 and sidewalls 446 are not connected to the gate voltage or to each other, and hence are floating.

Once the mesa is fully depleted, i.e., punched through, the reverse voltage on the p-n junction 450 in the mesa stops increasing, and the further voltage will be supported in the next mesa. As a result, each mesa supports the punch-through voltage of the mesa. For this termination to work, the punch-through voltage of the mesa needs to be less than the breakdown voltage of the p-n junction 450 in the mesa, and this determines the maximum mesa width that can be used. The total voltage that can be supported by the termination can be increased by adding more and more trench-mesa pairs to create a potential ladder. Note that in the termination region 402, the silicides 411 and 413 are floating.

Also shown in FIG. 4 is a drain contact 419 at the bottom that is connected to a drain region 418. The drain region 418 is in turn connected to the drift region 430. The trenches are filled with interlayer dielectric 440, and the device is topped with a passivation layer 410. In the active region 401, a gate silicide 405 connects a gate electrode 409 to a gate region 406. The dashed boundary 456 illustrates the depletion layer edge when the first termination mesa is fully depleted, and the second is partially depleted.

In the blocking state, the conductive silicide region atop each trench 411 will float to a potential that is different from the potential of the source and gate terminals, e.g., gate contact 409. By supporting a small potential between each trench pair, the structure of FIG. 4 forms a stepped potential ladder to sustain the device off-state blocking voltage. The termination features a P-N junction within each mesa that is shielded by the depletion of the mesas 454, such that the maximum voltage at the junction 450 stays below its breakdown voltage. This is in contrast, for example, to prior designs using a field plate contacted to mesas in the termination region.

For the vertical JFET devices described herein, e.g., as illustrated in FIGS. 2-18, mesas may vary in the range of 0.5 um to 2 um or more wide, and be 0.6 um to 3 um or more deep. Such mesas in the termination may support a standoff voltage of 10 to 40 V, for example. The number of termination rings, e.g., concentric mesas in the termination region, depends on the required support voltage. For example, to support 700 V in the blocking state with 20V/ring, at least 35 rings are required. Although active region mesas and termination region mesas may be created at the same time using the same materials and masks, the active area mesa widths need not be the same as termination area mesa widths. The width of the termination region mesas may be adjusted according to the desired standoff voltage.

FIG. 4 shows a few potential contours 452 at two mesas. These illustrate how this termination structure creates a potential ladder, where each of the floating silicide regions 4411 and 413 are at staggered potentials due to the voltages across the P-N junctions such as junction 450.

The basic methods for the various illustrative embodiments of the JFETs of the present invention are illustrated in FIGS. 5 through 11 with vertical cross-sectional views of a first illustrative embodiment of a JFET as a work in process. Silicon or SiC JFETs, for example, may be made using two dopant types, n-type and p-type. Herein "the first dopant type" refers to the gate implant type of the JFET, and the "the second dopant" type refers to the dopant type used for the source and drain. The descriptions of the structures and methods herein apply equally to n-channel and p-channel devices. An n-channel device uses n-type regions for source and drain, and has a p-type gate region.

Figure 5:
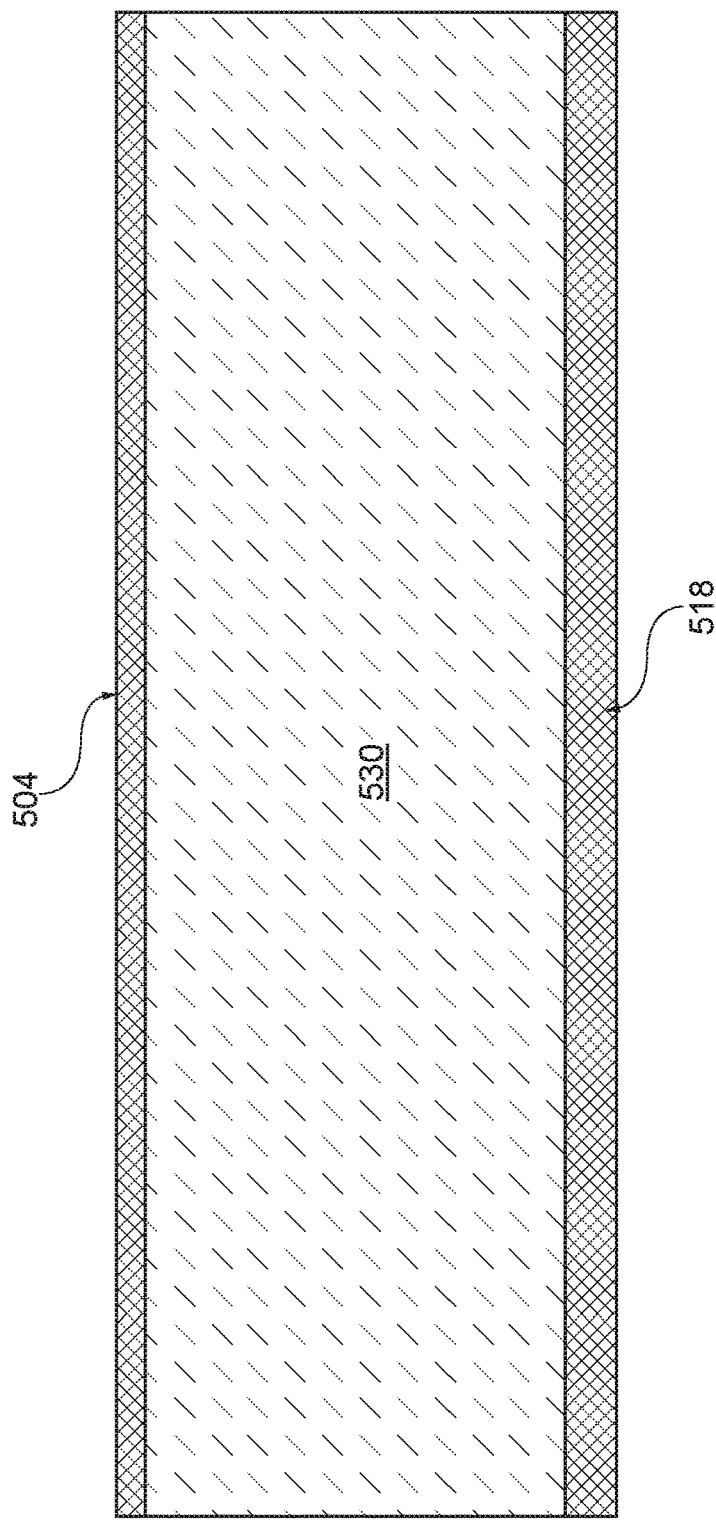
FIGS. 5-11 are cross-sectional views of the JFET of the first embodiment as a work in process through various stages of manufacture.

The starting material illustrated in FIG. 5 is a wafer containing a heavily doped top layer 504 of the second doping type to be used for source contacts. The top heavily doped region 504 can be formed either by epitaxy or by implantation, for example. Below that are a region of one more layers doped with the second doping type 530 for use as channel and drift regions. The layers 530 can could be formed by epitaxy. The bottom layer of the starting wafer is a heavily doped substrate 518 of the second doping type which will be used for a drain.

FIG. 6 illustrates a cross-sectional view of the JFET in process as seen after trench etching using a first mask. To create the structure shown, a hard masking layer 680 is first deposited on top of the heavily doped region of the second type 606. The hard masking layer 680 can be oxide, metal, or both, for example. Next, the hard masking layer 680 is patterned using the first mask, and etched. Then the trenches 605 in both the active cell region 601 and the termination region 602 are etched simultaneously using the hard masking layer 680. The trenches 617 extend into the drift region 630. Also shown in FIG. 6 is the drain region 618.

FIG. 7 illustrates a cross-sectional view of the JFET in process as seen after implantations of the first doping type. The implantations are performed without removing the hard masking layer 780. No additional masks are needed for this step. A vertical implantation of the first doping type forms the heavily doped regions 706 at the bottom of the trenches 717 in both the active cell region 701 and the termination region 702. The hard masking layer 780 protects source region 704 from being counter-doped by the implantation. A tilted implantation of the first doping type may be used to form the regions 726 on the side walls of the trenches 717. Sidewall regions 726 may optionally be less-heavily doped than the trench bottom regions 706. The hard mask 780 is removed after the implantations are completed, and the wafer is annealed to activate the implanted dopants, for example. Also shown in FIG. 7 are the drift region 730 and the drain region 718.

FIG. 8 illustrates a cross-sectional view of the JFET in process as seen after a self-aligned silicide contact formation. The silicide contacts 803 and 805 are formed simultaneously in the active region 801 and termination region 802, without using any masks. First, the oxide spacers 842 on the side walls of the trenches 817 are formed by depositing and/or growing oxide, followed by blanket etching back. Using an etching process that operates primarily vertically, the spacers 842 remain only on mesa sides. Next an ohmic metal, such as Ni, is deposited and annealed using rapid thermal annealing to form the silicides. Because Ni does not react with oxide, the silicide only forms on top of the second-doping-type regions 804 and the first-doping-type regions 806. The unreacted Ni on the oxide spacers 803 is then removed, and thus there is no shorting path between the silicide 803 and the silicide 805. Also shown in FIG. 8 are the drift region 830 and the drain region 818.

FIG. 9 illustrates a cross-sectional view of the JFET in progress as seen after contact window opening using a second mask. First an interlayer dielectric 940, such as oxide, is deposited on the wafer, filling the trenches. Next the second mask is used to pattern the contact windows to the source silicide 903 and a portion of the gate silicide 905. The windows are then cleared by etching. In the active region 901, the source contact windows 904 are opened in each of the cells. A shared gate contact window to the gate silicide 905 is opened outside the cells. In the termination region 902, no contact window is opened, and thus all the silicide contacts are under the inter-layer dielectric 940. Also shown in FIG. 9 are the drift region 930, the drain region 918, the gate region 906, and the source region 904.

FIG. 10 illustrates a cross-sectional view of the JFET in progress as seen after an overlay metal is defined using a third mask. A conductor such as a metal is deposited, patterned using the third mask, and etched, leaving source electrode 1008 and gate electrode 1009 separated by the interlayer dielectric 1040. In the active area 1001, the source electrode 1008 makes contact to the source silicide contacts 1003 on top of each mesa, and thereby to the source region 1004. Also in the active area 1001, the gate electrode 1009 makes contact to the gate silicide 1005 and thereby to the gate region 1006. In the termination region 1002, the silicide contacts 1011 and 1013 are not connected to any overlay metal, and thus their potentials float separately from each other and from other voltages in the device. Also shown in FIG. 10 are the drift region 1030, the drain region 1018, the termination region mesa top 1012, and the termination region trench side walls and bottom 1036, which are now distinct from the similarly formed structures in the active cell region 1001 by virtue of not being connected to the source or gate electrodes respectively.

FIG. 11 illustrates a cross-sectional view of the completed JFET as seen after forming a passivation layer using a fourth mask. To create this structure, a passivation material, such as benzo-cyclo-butene (BCB), may first deposited on top of the wafer. Next, in the active region 1101, the passivation layer 1110 is patterned using the fourth mask to open the windows through the passivation material to the source electrode metal 1108 and to the gate electrode metal 1109. No window through the passivation layer 1110 is opened in the termination region 1102. It is, of course, possible to entirely skip this passivation step, e.g., if the oxide layer under the BCB were sufficient to ensure device reliability.

Lastly, through backside processes such as wafer thinning, drain contact formation, and backside metallization, a drain contact 1119 is formed to complete the JFET process. Also shown in FIG. 11 are drain region 1118, drift region 1130, source silicide 1103, source region 1104, gate silicide 1105, gate region 1106, interlayer dielectric 1140, termination region silicides 1111 and 1113, and termination doped regions 1112, and 1136.

FIG. 12 illustrates a cross-sectional view of a second embodiment of a trench terminated JFET. The second embodiment is similar to the first embodiment shown, e.g., in FIGS. 5-11. However, here in FIG. 12, in the active region 1201, the sidewalls 1207 of the channel region of the mesa 1216A have been doped by an implantation of the second doping type. This is done to lower the channel resistance and achieve better control of the threshold voltage by raising the doping level higher than that of the drift region 1230 from which the mesas are formed. For example, such implantation may be done after the vertical and tilted implantations of the first doping type discussed above in reference to FIG. 7. The channel implantation of the second doping type may be done without using any mask (e.g., after the removal of the hard masking layer 780 of FIG. 7.) As a result, as seen in FIG. 12, the side wall 1227 of the mesa 1216B in the termination region 1202 is also doped by this implantation. This doped region 1227 in the termination region 1202 does not substantially affect the functionality of the trench guard-ring termination. It is possible to compensate for the added charges by reducing the width of the mesas 1205 in the termination region 1202. This implantation is followed by activation annealing.

Also shown in FIG. 12 are drain contact 1219, drain region 1218, drift region 1230, source silicide 1203, source region 1204, source electrode 1208, gate silicide 1205, gate region 1206, gate electrode 1209, interlayer dielectric 1240, passivation 1210, termination region silicides 1211 and 1213, and termination doped regions 1212 and 1226.

FIG. 13 is a cross-sectional view of a third illustrative embodiment of a trench terminated JFET. The third embodiment is similar to the second embodiment shown in FIG. 12, but here in FIG. 13, in the termination region 1302, the width of the trenches 1317 is narrower than the width of the trenches in the active cell region 1301. The tilted implantation of the first doping type is done simultaneously for the active cell region 1301 and the termination region 1302 using the same tilt angle. The tilt angle is chosen such that the side-wall first-doping-type region 1326 reaches the bottom of the first-doping-type region only in the active cell region 1301. In the termination region 1302, there is a gap between the side-wall of the first-doping-type region 1327 and the first-doping-type region 1336. This gap increases the voltage that can be supported in each mesa in the termination region 1302.

Also shown in FIG. 13 are drain contact 1319, drain region 1318, drift region 1330, source silicide 1303, source region 1304, source electrode 1308, gate silicide 1305, gate region 1306, gate electrode 1309, optional channel implant region 1307, interlayer dielectric 1340, passivation 1310, termination region silicides 1311 and 1313, and termination region mesa top doped region 1312, in addition to the ILD 1340, passivation 1340, and optional additional channel doping 1307.

FIG. 14 is a cross-sectional view of a fourth illustrative embodiment of a trench terminated JFET. The fourth embodiment is similar to the second embodiment shown in FIG. 12, but here in FIG. 14 the width of the trenches 1417 in the termination region 1402 is wider than the width of the trenches in the active cell region 1401. Further, a fifth mask is used to separate the first-doping-type implantations for the active cell region 1401 and the termination region 1402. The additional mask is applied after the implantations of the first-doping-type described with reference to FIG. 7. This mask blocks the active cells 1401 but is open in the termination region 1402. Then an additional implantation of the first-doping-type is done at a larger tilt angle, as compared to the tilt angle used for the implantation in the active cell region 1401. As a result, the first-doping-type region on the side wall 1446 is implanted deeper towards the center of the mesa in the termination region 1402 as compared to the analogous structure 1426 in the active region 1401. This makes the mesas 1416 in the termination region 1402 easier to deplete and improves the termination.

Also shown in FIG. 14 are drain contact 1419, drain region 1418, drift region 1430, source silicide 1403, source region 1404, optional channel implant 1407, source electrode 1408, gate silicide 1405, gate region 1406, gate electrode 1409, interlayer dielectric 1440, passivation 1410, termination region silicides 1411 and 1413, and termination doped regions 1412 and 1436, and optional doped region 1427.

FIG. 15 is a cross-sectional view of a fifth illustrative embodiment of a trench terminated JFET. The fifth embodiment is similar to the second embodiment shown in FIG. 12, but here in FIG. 15 a sixth mask is used so that no silicide will be formed in the termination region 1502. This sixth mask brings the total mask count to five for the process: trench, Ni block, contact, metal, and passivation. Silicide, including gate silicide 1505 and source silicide 1503, only forms in the active cell region 1501. The sixth mask can work either by stopping Ni from being deposited in the termination region 1502, or by leaving oxide in the termination region 1502 so that Ni cannot react with the semiconductor. This would occur during the methods discussed in reference to FIG. 8.

Also shown in FIG. 15 are drain contact 1519, drain region 1518, drift region 1530, source region 1504, optional channel implant 1507, source electrode 1508, gate region 1506, gate electrode 1509, interlayer dielectric 1540, passivation 1510, and termination doped regions 1512 and 1536, and optional termination doped region 1527.

FIG. 16 is a cross-sectional view of a sixth illustrative embodiment of a trench terminated JFET. The sixth embodiment is similar to the second embodiment shown in FIG. 12, but here in FIG. 16 a seventh mask is used to prevent the optional channel implant of the second type from entering the termination region 1602. The optional channel implant of the second doping type 1607 only forms in the active cell region 1601. This seventh mask brings the total mask count to five for the process: trench, channel implant block, contact, metal, and passivation.

Also shown in FIG. 16 are drain contact 1619, drain region 1618, drift region 1630, source region 1604, source silicide 1603, source electrode 1608, gate region 1606, gate silicide 1605, gate electrode 1609, interlayer dielectric 1640, passivation 1610, and termination silicides 1611 and 1613, and termination doped regions 1612 and 1636.

FIG. 17 is a cross-sectional view of a seventh illustrative embodiment of a trench terminated JFET. Here in FIG. 17 a seventh mask is used to prevent the optional channel implant of the second doping type from getting into the termination region 1702. The seventh mask is also used to prevent the growth of oxide spacers and formation of gate and source silicide in the termination region. One method to achieve this structure, for example, is to deposit an oxide layer after the gate implants of the first doping type, then pattern the oxide layer to open only the active area 1701 before performing the further channel implants and silicide formation steps. Thus, the channel implant only forms the second-doping-type region 1707 in the active cells 1701, and the gate silicide 1705 and source silicide 1703 only form in the active cells 1701. This seventh mask brings the total mask count to five for the process: trench, channel implant and silicide block, contact, metal, and passivation.

Also shown in FIG. 17 are a drain contact 1719, drain region 1718, drift region 1730, source region 1704, source silicide 1703, source electrode 1708, gate region 1706, gate silicide 1705, gate electrode 1709, channel implant 1707, interlayer dielectric 1740, passivation 1710, and termination doped regions 1712 and 1736.

FIG. 18 is a cross-sectional view of an eighth illustrative embodiment of a trench terminated JFET. The eighth embodiment is similar to the fifth embodiment shown in FIG. 15. Here in FIG. 18 an eighth mask is used to keep the heavily doped wafer top layer, which is used to form the source regions 1804 in the active region 1801, from being formed in the termination region 1802. In FIG. 5, the starting wafer is shown as having a layer 504 of a second doping typing that will become the source region 1804. Layer 504 may be created by epitaxy or implantation, for example. The JFET depicted in FIG. 18 may be created by using such a starting wafer by using the eighth mask to control the etching away of the top heavily doped region of the second doping type in the termination region 1802, leaving the top heavily doped region of the second type only in the active region 1801. This eighth mask brings the total mask count to five for the process: source pattern, trench, contact, metal, and passivation.

Alternatively, the JFET depicted in FIG. 18 may be created by using a starting wafer that does not have the top heavily doped region of the second doping type, and then using the eighth mask to control the implantation of a top heavily doped region of the second doping in the active region termination region 1802, leaving the top heavily doped region of the second type only in the active region. As another alternative, an eighth mask may be used to control the selective removal of source regions in the termination region 1802 after the formation of the mesas.

Also shown in FIG. 18 are drain contact 1819, drain region 1818, drift region 1830, source electrode 1808, source silicide 1803, gate region 1806, gate silicide 1805, gate electrode 1809, interlayer dielectric 1840, passivation 1810, optional channel doping 1807, and termination doped region 1846 and optional termination doped region 1827.

The options described herein are independent and may be combined in any number of ways to produce vertical JFET devices with ladder termination regions. The termination regions may be made: (a) with or without silicides; (b) with or without vertical regions of the second doping type at a different doping concentration level than the center of the mesa; (c) mesas or trenches that are a different width than those in the active cell region; (d) with or without regions of heaving doping of the second type on the tops of the mesas; and (e) with trench vertical sidewall regions of doping of the first type that do or do not extend do to regions of doping of the first type at the bottom of the trench, or any combination therefore. Similarly, the active cell region may be made with or without vertical channel doping regions, whether or not analogous structures are found in the termination region.

In describing embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A vertical JFET, comprising:
   a) a substrate, the substrate having a top and a bottom vertically, the substrate having a perimeter horizontally;
   b) an active cell region, the active cell region being on the top of the substrate and comprising source regions, gate regions, active region trenches, and active region mesas;
   c) a backside drain connection, the backside drain connection being on the bottom of the substrate;
   d) a termination region, the termination region being on the top of the substrate and comprising termination region trenches and termination region mesas;
   e) in each mesa of the termination region, a faux-source region, the faux-source region being at the top of the mesa and having an N doping type and a doping concentration that is the same as the doping concentration of the source regions, wherein the faux-source regions are ohmically isolated from each other and from the source regions; and
   f) in each termination region mesa, a faux-gate region, the faux-gate region being on each wall of the mesa and having a P doping type and a doping concentration that is the same as the doping concentration of the gate regions, wherein the faux-gate regions are ohmically isolated from each other and from the gate regions,
   g) such that in each mesa of the termination region, the faux-gate regions on each wall of the mesa abut and form a PNP structure with the faux-source region.

2. The vertical JFET of claim 1, further comprising, in each termination region mesa, a first floating silicide contact, the first floating silicide contact being atop the faux-source region, wherein the first floating silicide contacts are ohmically isolated from each other, from the source and from the gate regions.

3. The vertical JFET of claim 1, wherein the wherein the vertical JFET has an overall standoff voltage of 100 volts or more.

4. The vertical JFET of claim 1, wherein the wherein the vertical JFET has an overall standoff voltage of 1,000 volts or more.

5. The vertical JFET of claim 1, wherein the vertical JFET has an overall standoff voltage of 1,500 volts or more.

6. The vertical JFET of claim 1, wherein the substrate comprises silicon carbide.

7. The vertical JFET of claim 1, wherein the substrate comprises GaN, AlN, $Ga_2O_3$, or diamond.

8. The vertical JFET of claim 1, wherein the trenches of the termination region are of the same depth as the trenches of the active region.

9. The vertical JFET of claim 1, wherein the trenches of the termination region are of a different width from the trenches of the active region.

10. The vertical JFET of claim 1, wherein:
    a) the termination region surrounds the active cell region; and
    b) the termination region comprises two or more trenches between the active cell region and the perimeter.

11. The vertical JFET of claim 1, wherein the faux-gate regions extend down to, and across, the bottoms of the trenches in the termination region.

12. The vertical JFET of claim 11, further comprising gaps between the faux-gate regions and the bottoms of the trenches in the termination region.

13. The vertical JFET of claim 1, further comprising, in the mesas of the termination region, between the center of the mesas and the faux-gate regions, regions of N doping type that are more heavily doped than the body of the substrate.

14. The vertical JFET of claim 1, wherein a punch-through breakdown voltage of the PNP structure is lower than an avalanche breakdown voltage of a reverse biased PN junction between the faux-source region and the faux-gate region.

15. The vertical JFET of claim 14, wherein a maximum blocking voltage of the termination region is the sum of the individual punch-through voltages of the PNP structures in a potential ladder of PNP structures spanning the termination region.

16. The vertical JFET of claim 1, wherein the vertical JFET has an off-state blocking voltage equal to or below the maximum blocking voltage of the termination region.

17. The vertical JFET of claim 2, further comprising, in each termination region trench, a second floating silicide contact, the second floating silicide contact being at the bottom of the trench, wherein the second floating silicide contacts are ohmically isolated from each other, the gate regions, and the source regions.

18. The vertical JFET of claim 17, wherein a punch-through breakdown voltage of the PNP structure is lower than an avalanche breakdown voltage of a reverse biased PN junction between the faux-source region and the faux-gate region.

19. The vertical JFET of claim 18, wherein a maximum blocking voltage of the termination region is the sum of the individual punch-through voltages of the PNP structures in a potential ladder of PNP structures spanning the termination region.

20. The vertical JFET of claim 19, wherein the vertical JFET has an off-state blocking voltage equal to or below the maximum blocking voltage of the termination region.

* * * * *